(12) United States Patent
Tanaka

(10) Patent No.: US 6,970,231 B2
(45) Date of Patent: Nov. 29, 2005

(54) EXPOSURE APPARATUS AND EXPOSURE METHOD

(75) Inventor: Hiroshi Tanaka, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 67 days.

(21) Appl. No.: 10/784,256

(22) Filed: Feb. 24, 2004

(65) Prior Publication Data

US 2004/0169833 A1 Sep. 2, 2004

(30) Foreign Application Priority Data

Feb. 28, 2003 (JP) ............................. 2003-053896

(51) Int. Cl.⁷ ...................... G03B 27/42; G01B 11/00
(52) U.S. Cl. ........................................ 355/53; 356/401
(58) Field of Search .................. 355/53, 67; 356/399, 356/400, 401

(56) References Cited

U.S. PATENT DOCUMENTS

| 5,249,016 A | 9/1993 | Tanaka ..................... 355/53 |
| 5,774,575 A | 6/1998 | Tanaka et al. ............. 382/149 |
| 5,815,594 A | 9/1998 | Tanaka ..................... 382/151 |
| 6,023,320 A * | 2/2000 | Kawashima ................. 355/53 |
| 2002/0154283 A1 | 10/2002 | Tanaka et al. ............. 355/53 |
| 2003/0053058 A1 | 3/2003 | Tanaka ..................... 356/401 |
| 2003/0053059 A1 | 3/2003 | Mishima et al. ........... 356/401 |
| 2003/0174330 A1 | 9/2003 | Tanaka et al. ............. 356/401 |
| 2003/0235330 A1 | 12/2003 | Tanaka ..................... 382/151 |

FOREIGN PATENT DOCUMENTS

| JP | 7-273018 | 10/1995 |
| JP | 9-275058 | 10/1997 |
| JP | 10-242043 | 9/1998 |

* cited by examiner

Primary Examiner—Alan Mathews
(74) Attorney, Agent, or Firm—Fitzpatrick, Cella, Harper & Scinto

(57) ABSTRACT

An exposure method of projecting a pattern of an original onto a substrate. The method includes steps of measuring a position of an alignment mark formed on the substrate, projecting the pattern onto the substrate based on a measurement result in the measurement step, and projecting, onto the substrate based on the measurement result, a mark, which has a known relative position from a reference pattern arranged on an original stage and to align the original stage and a substrate stage, and is arranged on the original stage and to form an alignment mark on the substrate.

8 Claims, 8 Drawing Sheets

F I G. 2
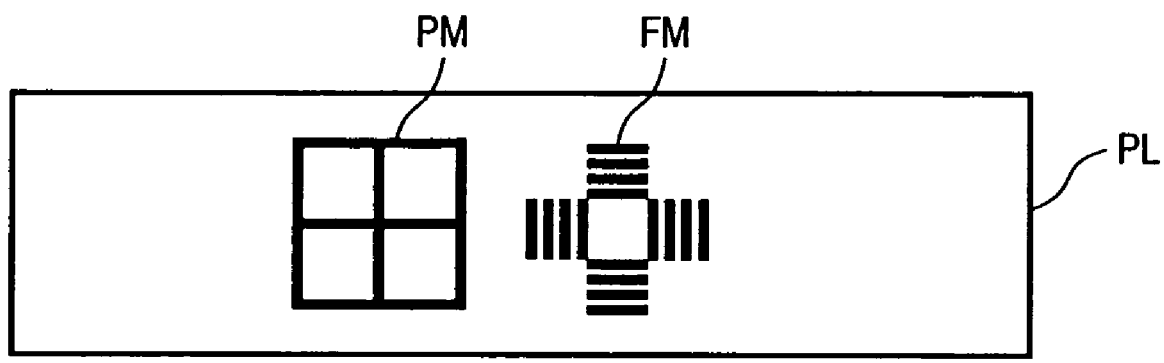

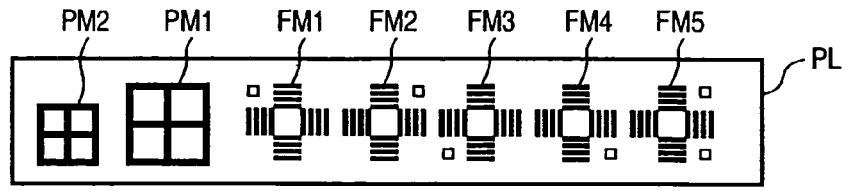
FIG. 6A
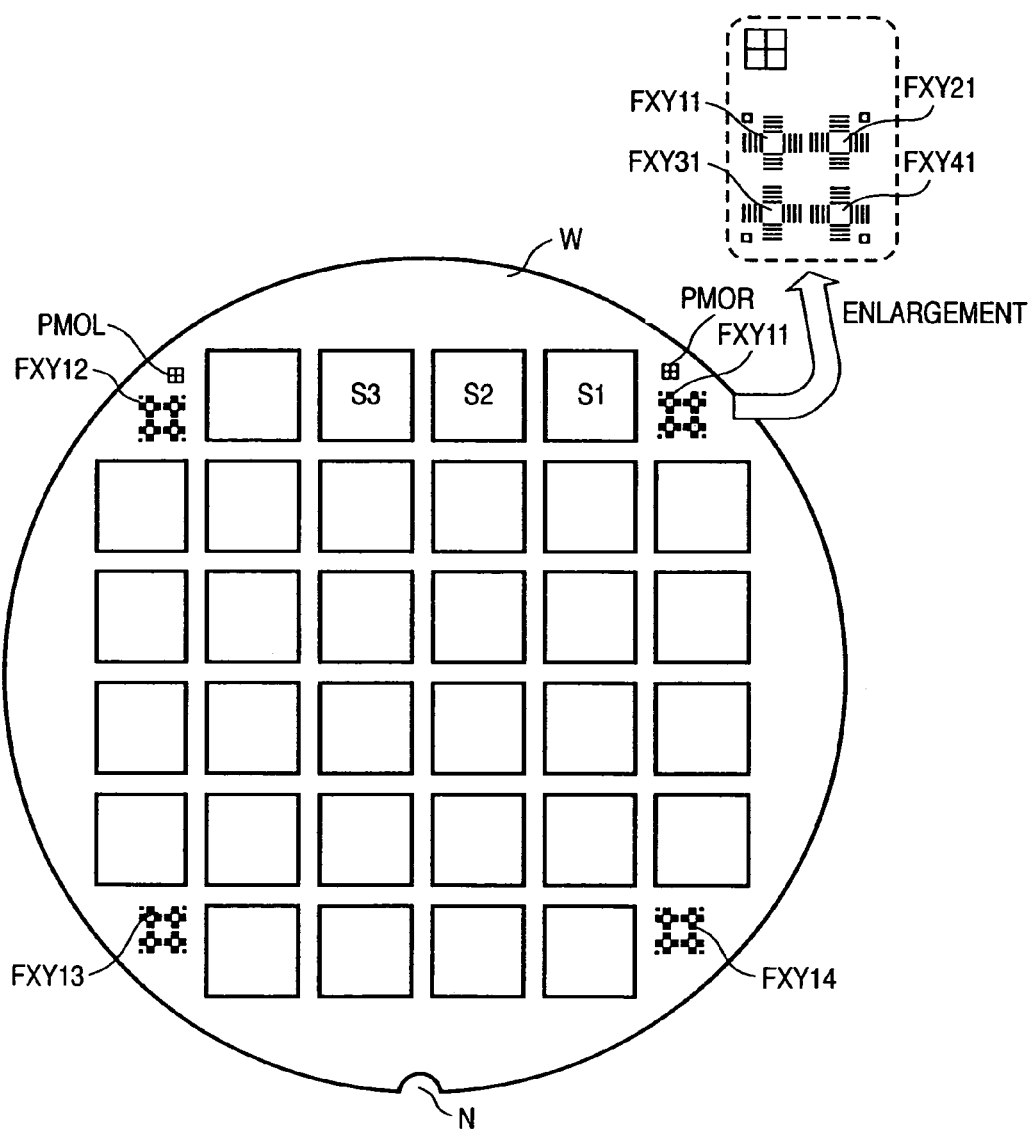
FIG. 6C
FIG. 6B

EXPOSURE APPARATUS AND EXPOSURE METHOD

FIELD OF THE INVENTION

The present invention relates to a technique for aligning a substrate.

BACKGROUND OF THE INVENTION

Semiconductors have recently been used not only for memories and CPUs, but also for CCDs and liquid crystal devices, and semiconductor exposure apparatuses have also been used to produce these devices. Video devices such as a CCD have color filters formed on chips for color display. A color filter is generally formed by applying a photoresist as a mixture of R, G, and B coloring agents onto an entire wafer surface, and forming a color filter on CCD pixel cells by a photo process.

The arrangement and operation of a typical semiconductor exposure apparatus will be explained with reference to FIG. 7.

A wafer W to be exposed is set on a resist coating device COAT by a transport robot (not shown) or the like. The resist coating device COAT applies a resist REG into a thin film from a nozzle CN onto the wafer W while rotating the wafer W. In order to strip the resist attached to the outer peripheral portion of the wafer W, the wafer W is transported to a resist rinsing device RINS. The resist rinsing mechanism is to spread a resist stripping solution RIN from the distal end of a nozzle RN and strip the resist from the outer peripheral portion. This step is executed to prevent contamination of the lower surface of the wafer W at the outer peripheral portion by the resist and contamination of the chip by stripping of the resist attached to the edge.

The wafer W is transported onto a wafer chuck CH on a two-dimensionally movable wafer stage STG within the exposure apparatus. In transportation, alignment measurement is executed to accurately measure the wafer position on the wafer stage STG. In alignment measurement, alignment marks (e.g., PMR, PML, and FXY1 (FX1 and FY1) to FXY4 (FX4 and FY4) in FIG. 4) on the wafer W are measured using an alignment scope SC and image processing device P.

For coarse detection (pre-alignment), the scaling factor of the alignment scope SC is set low to measure the positions of the pre-alignment marks PMR and PML. The purpose of coarse detection is to measure an error left when the wafer W transported to the wafer chuck CH is set on the wafer chuck CH, and reduce the error within the grasp range of high-precision detection. Movement to the pre-alignment marks PMR and PML is done by moving the wafer stage STG. The wafer stage STG is moved by a motor M in accordance with an instruction from a control device MC while the position of the wafer stage STG is accurately measured by a laser interferometer LP.

Light emitted by an alignment illumination device LI illuminates pre-alignment marks PMOL and PMOR via a half-mirror M1. Light beams reflected by the pre-alignment marks PML and PMR form images on a photoelectric conversion element S1 such as a CCD camera via the half-mirror M1 and a half-mirror M2. Video signals from the photoelectric conversion element S1 are converted into digital data by an analog/digital converter AD1. The digital data are stored in a memory MEM1, and the positions of the marks are calculated by an image processor COM1. The position of the wafer W is determined from the mark positions calculated by the image processor COM1 and a stage position designated by the control device MC.

In order to measure a precise wafer position (high-precision alignment), the scaling factor of the alignment scope SC is set high to obtain the positions of the high-precision alignment marks FXY1 to FXY4. Similar to coarse detection, the stage position is moved to the high-precision alignment mark FXY1 or the like. Light from the alignment illumination device LI irradiates the high-precision alignment mark FXY1 or the like, and reflected light is received by a sensor S2. The sensor S2 also adopts a photoelectric conversion element such as a CCD or CCD camera. An electrical signal from the sensor S2 is converted into a digital signal by an analog/digital converter AD2. The digital signal is stored in a memory MEM2, and the mark position is calculated by an image processor COM2. The mark positions of all the high-precision alignment marks FXY1 to FXY4 are determined by the same sequence, and the wafer position on the stage STG is accurately calculated.

After the end of alignment, the circuit pattern of a reticle R on a reticle stage RSTG is projected onto the resist on the wafer W via a projection lens LENS. In exposure, a masking blade MS is set in accordance with an exposure region (PAT in FIG. 8) on the reticle R. Light emitted by an exposure illumination device IL exposes the wafer W via the masking blade MS, reticle R, and projection lens LENS.

When the wafer W is applied to production of a color CCD element or the like, the resist applied by the resist coating device COAT may result in a resist containing R, G, and B coloring agents. In this case, illumination light may be absorbed in the resist in accordance with the wavelength of illumination light used in the alignment scope SC, failing to obtain a signal of a high-contrast alignment mark. As one solution for this problem, the wavelength of illumination light is changed to one which is not absorbed in the resist.

In this method, chromatic aberration of the alignment scope SC occurs. In a lens used for high-precision measurement, the wavelength width of light for use must be limited to minimize aberration. It is therefore difficult to greatly change the wavelength for R, G, and B colors. As another solution method, a resist which is applied onto an alignment mark on a wafer and contains a coloring agent is stripped.

To strip a resist from only the PMR portion and FXY1 portion in FIG. 4, the stripping solution must be applied to a narrow region (100 μm□), which is not practical. Considering this, there is proposed a method of printing an alignment pattern at the outer peripheral portion of the wafer W, and stripping the resist using the resist rinsing device RINS (see, e.g., Japanese Patent Laid-Open Nos. 7-273018, 9-275058, and 10-242043).

In recent years, the width of a scribe line for cutting an IC chip on a completed wafer becomes narrower in order to maximize the area of the circuit pattern. Demands have arisen for downsizing an alignment mark printed in a region such as a scribe line not serving as an IC chip. Depending on the step shape of the scribe line, it becomes difficult to detect an alignment mark due to distortion of an alignment mark signal. Under these circumstances, an alignment mark must be printed at a portion other than a scribe line.

When an exposure mark is formed at the end of a reticle in order to expose a scribe line to an alignment mark, the mark may deform owing to distortion. The mark deformation generates a measurement error, and the mark position, i.e., wafer position cannot be accurately measured.

To print an alignment mark at the outer peripheral portion of a wafer, Japanese Patent Laid-Open Nos. 9-275058 and 10-242043 propose a method of preparing exposure mark patterns PM and FM dedicated to alignment marks on the reticle R in addition to the circuit pattern PAT shown in FIG. 8. This method can also be applied when an alignment mark is projected onto an arbitrary portion.

The flow of circuit pattern exposure and alignment mark exposure in the above proposal will be roughly described.

Step 1: An exposure control program for exposure of a circuit pattern on a reticle is set.

Step 2: The masking blade is limited to the size of a circuit pattern region (PAT) on the reticle.

Step 3: The alignment mark of a wafer is measured to align the wafer and reticle.

Step 4: The wafer is exposed to the circuit pattern on the reticle.

Step 5: The program is changed to an exposure control program for exposure of an alignment mark pattern.

Step 6: The masking blade is limited to the region of a mark pattern (PM or FM) on the reticle.

Step 7: The wafer is exposed to the alignment mark.

This method has the following demerits (i) and (ii).

(i) This method requires two kinds of exposure control programs. For two or more kinds of alignment marks, three or more kinds of exposure control programs may be necessary.

(ii) Two regions, i.e. circuit and alignment mark regions, or more regions must be ensured on a reticle.

Since the exposure apparatus must be controlled using a plurality of exposure control programs, the program must be switched, decreasing the operation speed of the exposure apparatus. Further, transfer of a program to a plurality of apparatuses in advance requires a large capacity memory for storing the program. This requires increase in resources for managing the semiconductor production exposure control programs and capacity of a storage device such as a disk.

When the exposure apparatus is so constituted as to project a pattern within a fixed region on a reticle, no plurality of exposure control programs are required, but the limitations with respect to the circuit pattern area on the reticle increase. To prevent this, the exposure apparatus is arranged such that a circuit pattern and an alignment mark pattern are prepared on a reticle only as needed so as to project the alignment mark to an arbitrary portion. In this case, the above-mentioned problems arise.

SUMMARY OF THE INVENTION

It is an object of the present invention to solve the above mentioned problems (i) and (ii).

To solve the above-described problems and to achieve the object, according to the present invention, an exposure apparatus which projects a pattern on an original onto a substrate comprises an original stage which supports the original, a substrate stage which supports the substrate, a reference pattern which is arranged on the original stage and to align the original stage and the substrate stage, and a mark which is arranged on the original stage, has a known relative position from the reference pattern, and is to be projected onto the substrate to form an alignment mark on the substrate.

According to the present invention, as an exposure method of projecting a pattern on an original onto a substrate comprises steps of measuring a position of an alignment mark formed on the substrate, projecting the pattern onto the substrate based on a measurement result in the measurement step, and projecting onto the substrate based on the measurement result, a mark which has a known relative position from a reference pattern arranged on an original stage and to align the original stage and a substrate stage, and is arranged on the original stage and to form an alignment mark on the substrate.

Other objects and advantages besides those discussed above shall be apparent to those skilled in the art from the description of a preferred embodiment of the invention, which follows. In the description, reference is made to the accompanying drawings, which form a part thereof, and which illustrate an example of the invention. Such an example, however, is not exhaustive of the various embodiments of the invention, and therefore reference is made to the claims, which follow the description for determining the scope of the invention.

BRIEF DESCRIPTION OF THE DRAWINGS

FIG. 2 is a schematic view showing a reticle reference plate according to the embodiment of the present invention;

FIGS. 6A to 6C are schematic views showing a reticle reference plate and wafer according to the third embodiment;

DETAILED DESCRIPTION OF THE PREFERRED EMBODIMENTS

Preferred embodiments according to the present invention will be described in detail below with reference to the accompanying drawings.

[First Embodiment]

Figure 1:
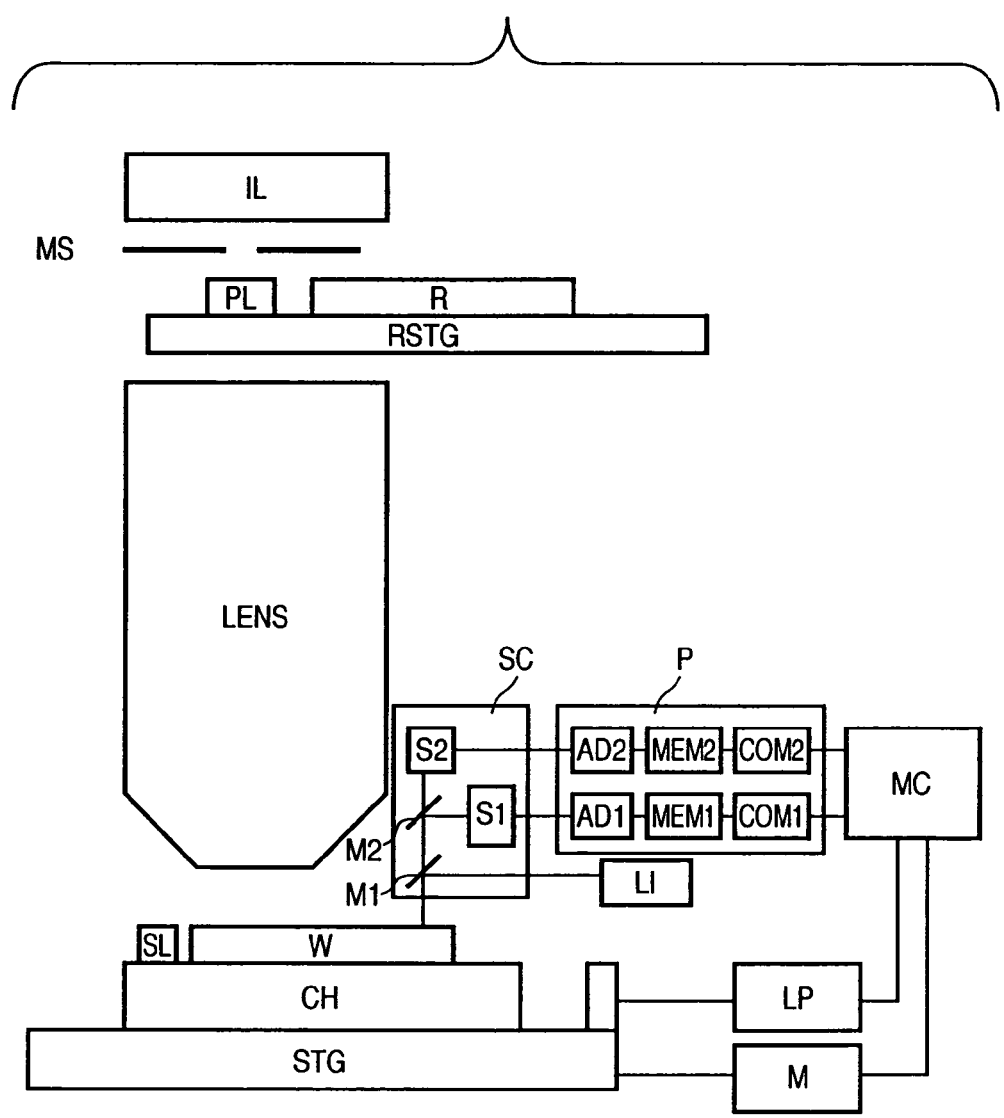
FIG. 1 is a schematic view showing a semiconductor manufacturing apparatus according to an embodiment of the present invention.
Figure 3:
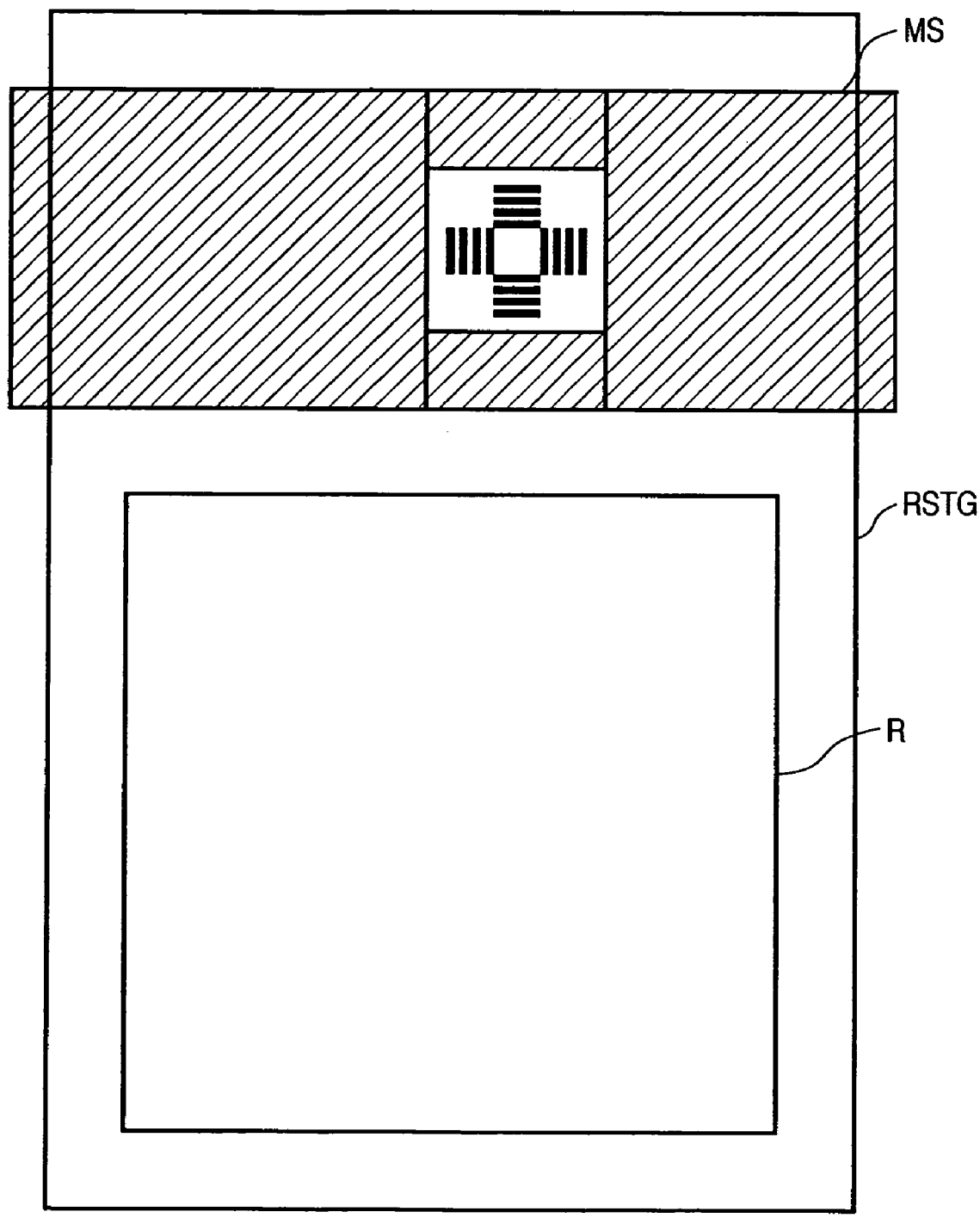
FIG. 3 is a schematic view showing a reticle stage and masking blade according to the embodiment of the present invention.

FIG. 1 is a schematic view showing a semiconductor manufacturing apparatus according to the first embodiment of the present invention. FIG. 2 is a schematic view showing a reticle reference plate according to the first embodiment of the present invention. FIG. 3 is a view schematically showing a reticle stage and masking blade according to the embodiment of the present invention.

In FIGS. 1 to 3, in the semiconductor exposure apparatus shown in FIG. 1, a reticle reference plate PL is set on a reticle stage RSTG which holds a reticle R. The role of the reticle reference plate PL is to measure the positional relationship with a mark SLM (see FIGS. 5A to 5C) on a stage reference plate SL mounted on a two-dimensionally movable wafer stage STG. This determines the positional relationship between the reticle stage RSTG and the wafer stage STG. The stages RSTG and STG are so aligned as to set the positional relationship to 0. In this state, a wafer W aligned by the following method is accurately exposed to a pattern on the reticle R via a projection lens LENS. Note that even a conventional semiconductor manufacturing apparatus mounts a plate corresponding to the reticle reference plate PL.

The reticle reference plate PL has a pre-alignment mark PM and high-precision alignment mark FM shown in FIG. 2. As is apparent from FIG. 1, light from an illumination light source IL can illuminate the wafer W via the reticle reference plate PL and projection lens LENS. When a mark pattern is formed on the reticle reference plate PL, it can be projected onto the wafer W. The imaging plane of the reticle reference plate PL is identical to that of the reticle R. The image on the reticle reference plate PL is accurately formed on the imaging plane of the projection lens, and an in-focus image is projected onto the wafer W. Hence, by forming an exposure alignment mark pattern on the reticle reference plate PL in advance, the alignment mark can be projected onto the wafer W. The pattern on the reticle reference plate PL is formed by etching a film of chromium or the like.

Figure 4:
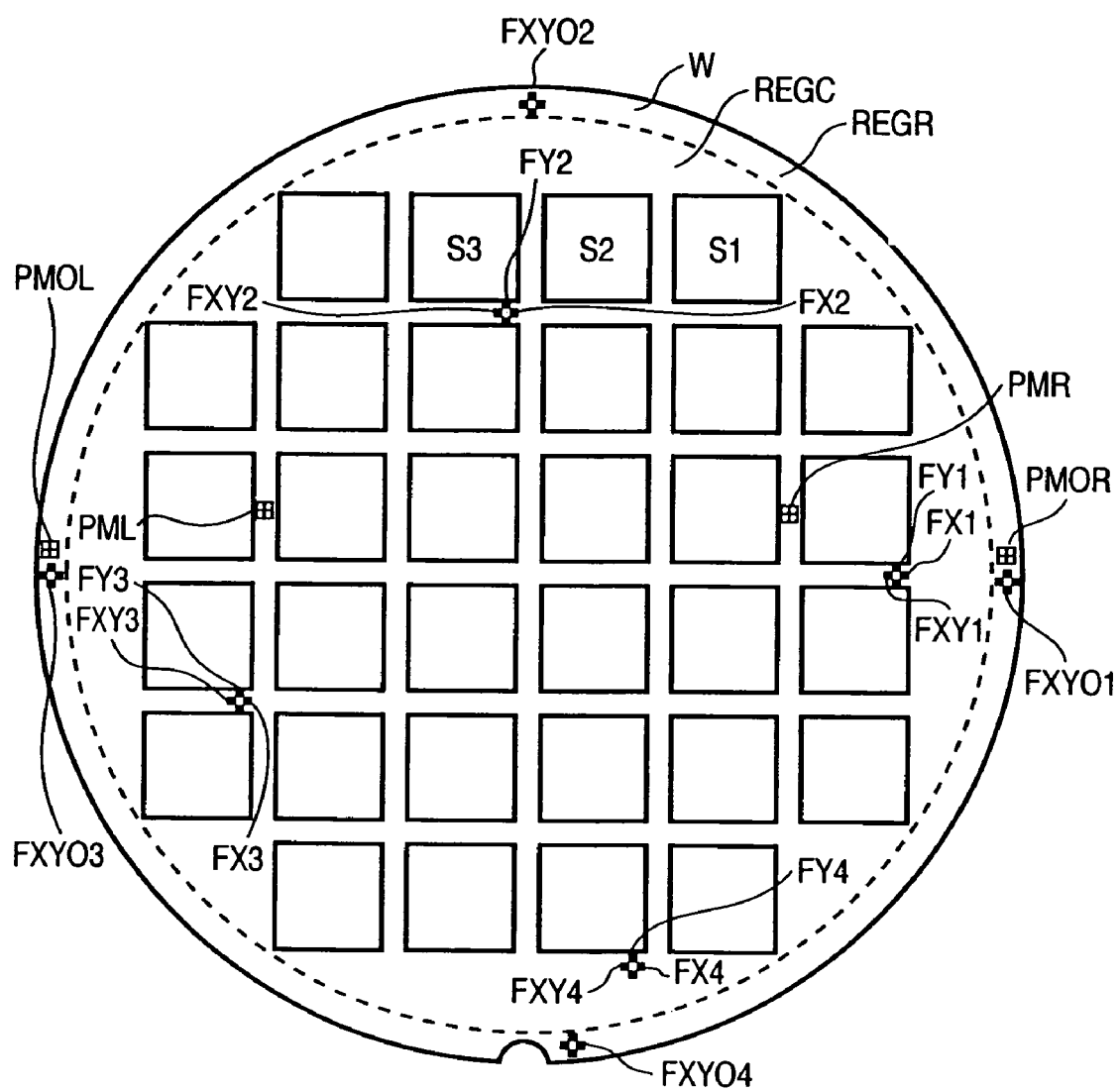
FIG. 4 is a schematic view showing a wafer according to the first embodiment.

The reticle reference plate PL has the mark PM for projecting pre-alignment marks PMOL and PMOR in FIG. 4, and the mark FM for projecting high-precision alignment marks FXY01 to FXY04. In projecting these marks PM and FM onto arbitrary portions on the wafer W, the marks PM and FM cannot be simultaneously projected. Thus, a masking blade MS is so driven as to irradiate only the region of the mark PM or FM on the reticle reference plate PL with exposure light. FIG. 3 is a view showing the reticle stage RSTG when viewed from the top. FIG. 3 shows a state in which the masking blade MS is so set as to irradiate only the region of the mark FM with exposure light.

The mark PM or FM can be projected onto a designated position on the wafer W by setting the masking blade MS to the region of a mark to be projected and moving the wafer stage STG to a position where the mark is to be projected. In this manner, the marks PMOL, PMOR, and FXY01 to FXY04 are projected onto an outer peripheral portion REGR of the wafer W, as shown in FIG. 4.

The exposure flow of a series of operations from loading of the wafer W into the exposure apparatus to unloading of the wafer W will be explained with reference to FIGS. 1 to 4. For descriptive convenience, pre-alignment marks PML and PMR exist at an inner peripheral portion REGC (surface inward from the outer peripheral portion REGR) of the wafer W.

As shown in FIGS. 1 to 4, the wafer W is loaded into a resist coating device COAT, coated with a resist REG, and then transferred onto a wafer chuck CH mounted on the stage STG of the exposure apparatus. The two marks PML and PMR of the wafer W on the wafer chuck CH are measured by a low-scaling-factor measurement method using an alignment scope SC. By this measurement, the positions X, Y, and θ of the wafer W on the stage STG are measured and corrected. High-precision alignment marks FXY1 to FXY4 are measured by a high-scaling-factor measurement method using the alignment scope SC. By this measurement, the position of the wafer W is more accurately obtained, ending alignment measurement.

In low-scaling-factor measurement, light emitted by an alignment illumination device LI illuminates the pre-alignment marks PML and PMR via a half-mirror M1. Light beams reflected by the marks form images on a photoelectric conversion element S1 such as a CCD camera via the half-mirror M1 and a half-mirror M2. Video signals from the photoelectric conversion element S1 are converted into digital data by an analog/digital converter AD1, and the digital data are stored in a memory MEM1. An image processor COM1 calculates the positions of the marks. The position of the wafer W is determined from the mark positions calculated by the image processor COM1 and a stage position designated by a control device MC.

In high-scaling-factor measurement, light emitted by the alignment illumination device LI irradiates the high-precision alignment mark FXY1 or the like, and reflected light is received by a sensor S2. The sensor S2 is also formed by a photoelectric conversion element such as a CCD camera. An electrical signal from the sensor S2 is converted into a digital signal by an analog/digital converter AD2, and the digital signal is stored in a memory MEM2. An image processor COM2 calculates the mark position.

The masking blade MS is so set as to expose the entire surface of the circuit pattern on the reticle R. The pattern on the reticle R is sequentially projected into regions S1, S2, S3, . . . , on the wafer W in accordance with the alignment measurement result.

The masking blade MS is set to the region of the mark PM (see FIGS. 2 and 3). While the wafer stage STG is driven, the pattern PM is projected onto the outer peripheral portion (positions of the marks PMOL and PMOR) of the wafer W. The masking blade MS is set to the region of the mark FM. While the stage STG is driven, the pattern FM is projected onto the outer peripheral portion (positions of the marks FXY01 to FXY04) of the wafer W. Wafer exposure processing is then completed.

As described above, the alignment marks PM and FM are projected onto the outer peripheral portion of the wafer W by using alignment mark patterns on the reticle reference plate PL. Unlike the prior art, no exposure control program need be switched, and no pattern for projecting an alignment mark onto the reticle R need be prepared. The exposure apparatus can project alignment marks onto the wafer W by using only existing functions.

The resist of the formed wafer is developed, and an alignment mark is printed at the outer peripheral portion of the wafer via etching processing or the like. The cleaned wafer from which the resist is stripped via the edging step or the like shifts to the next exposure step. For example, the wafer is coated with a resist containing coloring agents for a color filter, and the resist is stripped from only the outer peripheral portion by a resist rinsing device. Since no resist exists in the alignment mark, the mark observed by the alignment scope does not exhibit any distortion or decrease in contrast caused by the resist. Accordingly, alignment can be executed at the highest precision.

The interrelationship among an exposure alignment mark on the reticle reference plate PL, an exposure alignment mark pattern, and wafer alignment will be explained with reference to FIGS. 5A to 5C.

Figure 5A:
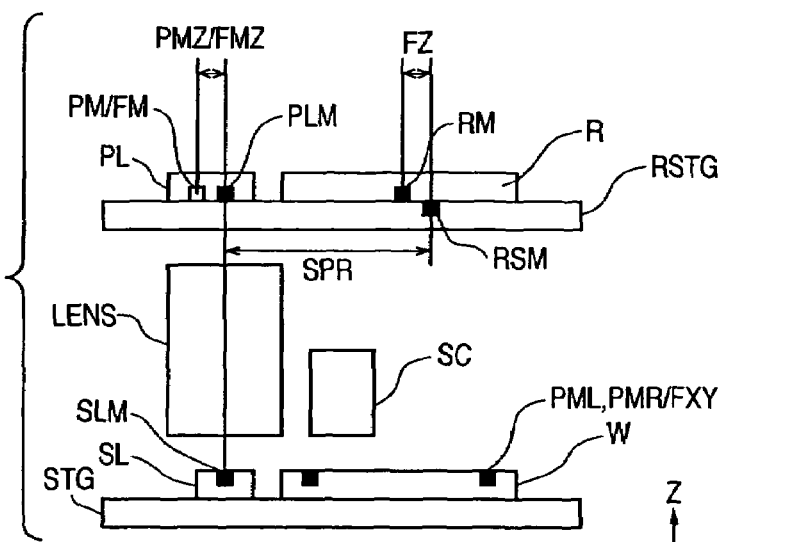
FIGS. 5A to 5C are views showing the positional relationship between an alignment mark and an exposure mark according to the embodiment of the present invention.
Figure 5B:
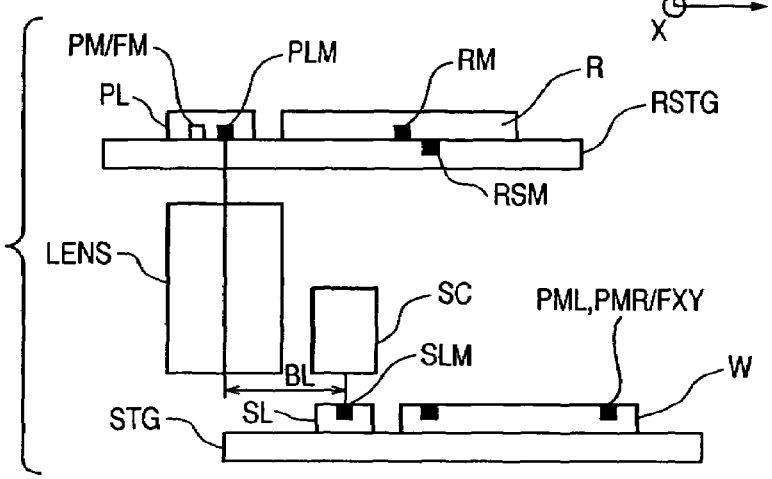
Figure 5C:
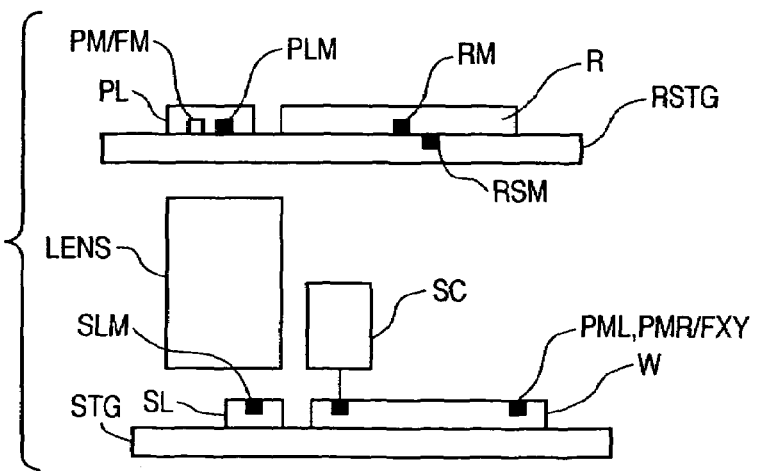
Figure 7:
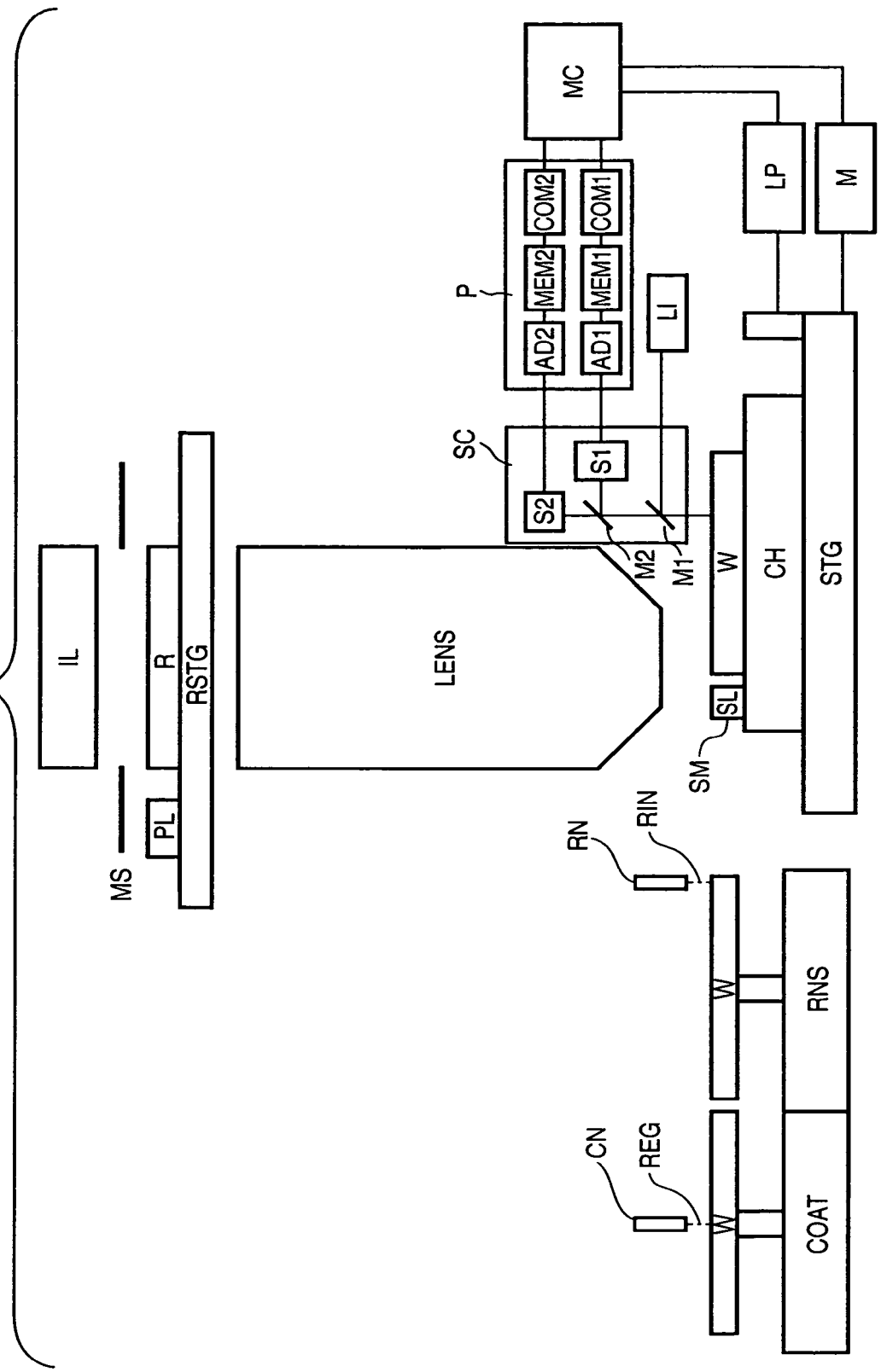
FIG. 7 is a schematic view showing a conventional semiconductor manufacturing apparatus.
Figure 8:
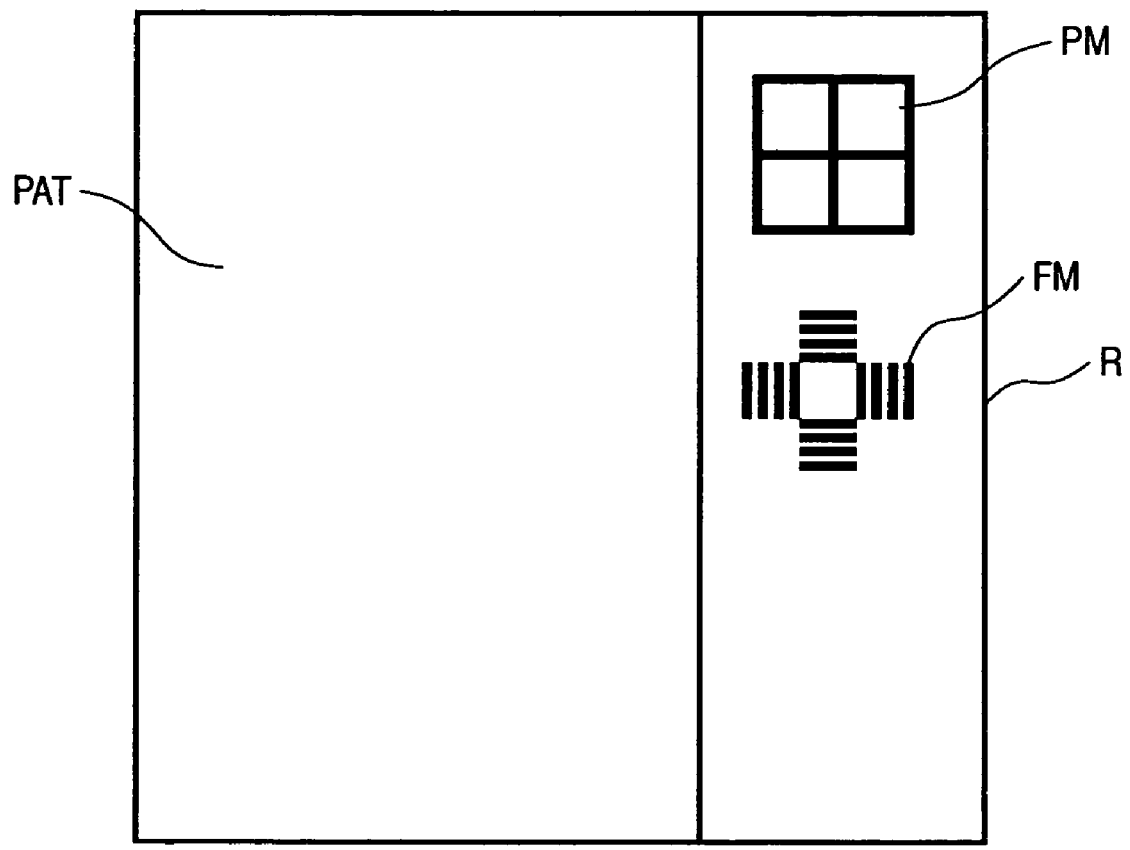
FIG. 8 is a view showing a conventional reticle.

In FIGS. 5A to 5C, SPR represents the distance between a reticle stage reference mark PLM and a reticle reference mark RSM on the reticle reference plate PL. This distance is measured in advance. FZ represents the relative shift amount between the reticle reference mark RSM and a mark RM on the reticle, and is measured in reticle alignment. PMZ represents the distance between the reticle stage reference mark PLM and the mark PM on the reticle reference plate PL. Pattern data and data in drawing on the plate PL are measured in advance. Similarly, FMZ represents the distance between the reticle stage reference mark PLM and the mark FM on the reticle reference plate PL. Pattern data and data in drawing on the plate PL are measured in advance.

When the circuit pattern of the reticle R is to be drawn at the lens center, the reticle stage RSTG is shifted by SPR-FZ by using the reticle stage reference mark PLM as the reference of the reticle stage RSTG, and then exposure is done. Also when the mark PM or FM is to be projected, the reticle stage RSTG is shifted by PMZ or FMZ to perform exposure, the shift amount from the lens center is reset to 0, and then exposure is done (FIG. 5A).

On the wafer W, the wafer stage reference mark SLM on the stage reference plate SL is measured using the reticle stage reference mark PLM as a reference. The stage reference plate SL is moved below the alignment scope SC to measure the same mark SLM. A baseline BL serving as the distance between the lens center and the alignment scope SC is obtained from the stage movement distance, the shift amount between the marks PLM and SLM, and the shift amount of the mark SLM on the alignment scope SC (FIG. 5B).

In alignment of the wafer W, the alignment marks PML, PMR, and FXY1 to FXY4 on the wafer W are measured using the alignment scope SC, and the wafer center on the wafer stage STG is determined. Since the distance (baseline BL) between the lens center and the scope SC is measured in advance, the wafer center on the stage STG is determined by measurement at the lens center by subtracting BL from a measurement value. Exposure is performed using the wafer center as a reference (FIG. 5C).

Movement in a direction (Y direction) parallel to the sheet surface in FIGS. 5A to 5C has been described. The above description can also be applied to movement in a direction (X direction) perpendicular to the sheet surface. As for the wafer position on the wafer stage STG, not only the X and Y positions, but also an amount (rotation component) by which the wafer W is rotated and mounted on the stage STG, and a wafer expansion/contraction amount (scaling component) are measured.

To expose each exposure shot on the wafer W to the pattern of the reticle R, the rotation component and scaling component are reflected in the distance to a predetermined exposure shot, and the wafer stage STG is moved to the measured wafer center position reference. While the shift amount FZ from the reticle R is reflected in the reticle stage RSTG, the wafer W and reticle R are made to coincide with the center of the lens LENS. In this state, exposure is performed. Exposure may be cell exposure or scanning exposure.

Similarly, as for the marks PM and FM, the rotation component and scaling component are reflected in the distance to a predetermined exposure position, and the wafer stage STG is moved to the measured wafer center position reference. While the distance FMZ or PMZ is reflected in the reticle stage RSTG, the wafer W and exposure mark are made to coincide with the center of the lens LENS. In this state, exposure is performed. Exposure may be cell exposure or scanning exposure.

In this way, both the exposure pattern of the reticle R and the alignment mark pattern on the reticle reference plate PL are aligned to the layout on the wafer W, and projected onto the wafer W. Alignment is executed using these projected alignment marks in subsequent steps, and accurate alignment corresponding to the layout on the wafer can be achieved.

The first embodiment has exemplified an exposure apparatus (scanning exposure apparatus or the like) in which the reticle stage RSTG is movable. Even in an exposure apparatus in which the reticle stage RSTG is fixed, the same alignment mark exposure as that in the first embodiment can be realized by the arrangement of the masking blade and movement of the wafer stage as far as the alignment mark falls outside the reticle region and within the projectable region of the projection lens.

Also in an electron beam exposure apparatus, the alignment mark can be projected onto an arbitrary portion by an electron beam via movement of the wafer stage.

[Second Embodiment]

The first embodiment has described a method of stripping the resist REG to expose an alignment mark. When the transmittance of the resist REG is high, no resist REG need be stripped. The second embodiment is the same as the first embodiment in exposure of an alignment mark except that no resist REG is stripped. The characteristic feature of this method is that an alignment mark printed on a conventional scribe line can be projected onto an arbitrary portion on a wafer. For example, an alignment mark is projected onto a peripheral wafer region where no chip can be formed. In general, the semiconductor chip is rectangular, but the wafer is circular. This produces a plurality of fan-shaped regions where no chip can be formed. Alignment marks are projected onto arbitrary portions in the fan-shaped regions. FIGS. 6B and 6C show an example in which alignment marks are arranged in fan-shaped regions formed at four corners owing to the layout.

The second embodiment has also exemplified an exposure apparatus in which the reticle stage is movable. Even in an exposure apparatus in which a reticle stage RSTG is fixed, the same alignment mark exposure as that in the second embodiment can be realized by the arrangement of the masking blade and movement of the wafer stage as far as the alignment mark falls outside the reticle region and within the projectable region of the projection lens.

Also in an electron beam exposure apparatus, the alignment mark can be projected onto an arbitrary portion by an electron beam via movement of the wafer stage.

[Third Embodiment]

In the above-described embodiments, an alignment mark to be projected can be formed at an arbitrary portion on a wafer. When an alignment mark is projected onto a portion near the alignment mark of a preceding layer, the similar alignment marks are arranged adjacent to each other. In alignment mark measurement, a mark other than a target may be detected. This results in a measurement error, and no accurate wafer position can be obtained. To identify an exposed alignment mark, different marks are used such that the shape or size is changed or auxiliary patterns with different shapes are added. As shown in FIG. 6A, various marks are prepared as the marks PM and FM. For example, PM2 is arranged as a size change (reduction) example of PM1, and FM1, FM2, FM3, FM4, and FM5 prepared by adding different identification marks to FM are arranged. The identification mark and mark deformation example are not limited to the types shown in FIG. 6A as far as a mark can be detected.

Also, when four alignment marks FXY11, FXY21, FXY31, and FXY41 are printed in fan-shaped regions shown in FIG. 6B, these marks are formed as alignment marks each having one of four different types of identification marks FM1, FM2, FM3, and FM4. For example, when the shape of mark FM1 represents a target alignment mark, a square identification mark is added to the upper left portion of the mark. An image processing device P recognizes the mark on the basis of this mark type information.

In exposure control, the following settings are done.

(1) Setting of an exposure control program (alignment mark coordinates, the shape (mark type) of the identification mark, the layout, and the like).

(2) Alignment mark printing control information (control information on whether to print a new alignment mark or not, the shape (type) of an alignment mark to be newly printed, the coordinates of an alignment mark to be newly printed, and the like).

An alignment mark on the wafer that is designated by these settings is identified and detected. The wafer position is accurately measured, and the pattern on the reticle is projected. The masking blade is adjusted to a designated alignment mark, and the alignment mark is projected at designated coordinates. An alignment mark to be newly printed is projected onto a designated position on the wafer whose position has accurately been measured. Thus, the alignment mark is accurately aligned to the layout.

In a detailed exposure control program, for example, PM1 and FM1 are set as identification mark shapes. As shown in FIG. 6B, the positions of marks PMOL and PMOR are measured using PM1 to measure rough X, Y, and $\theta$ positions. FXY11, FXY12, FXY13, and FXY14 are measured using FM1. Control information on printing an alignment mark represents that FM5 is used as a new alignment mark and is to be printed at four predetermined portions on the wafer.

As for identification of an auxiliary pattern, the presence/absence of an identification mark is determined using the low-scaling-factor detection system of the alignment scope after template matching of the mark. If no identification mark is detected, an erroneous mark exists below the scope, and whether a correct mark exists within the field of view is detected. If a correct mark exists, the stage is moved to the position of the mark to calculate the accurate position of the mark using the high-scaling-factor system. Instead of separately determining an identification mark, the template may have an identification mark, or a template which detects a mark in a different shape may be adopted.

Even if no target mark is found in adjacent marks, the stage can be moved to the target mark because the relative distance to the target mark has been known. More specifically, even when not all the four marks shown in FIG. 6C fall within the field of view of the low-scaling-factor system and the target mark FXY11 does not fall within the field of view, the position of FXY11 can be confirmed from the known relative distance between FXY11 and FXY41 as far as FXY41 exists within the field of view and can be detected. The positions and shapes (types) of marks which have been printed are stored as a log in the exposure control program.

If the relative distance to a target mark is known, the target mark position can also be calculated from a detected mark position and the known relative distance without moving the stage to the target mark.

In this manner, even when alignment marks are sequentially printed in a narrow region, erroneous mark recognition can be suppressed without any restrictions by a scribe line.

Alternatively, at least one designated type of pattern out of a plurality of alignment mark patterns of different shapes (types) on a reticle may be projected onto a wafer.

The third embodiment has also exemplified an exposure apparatus in which the reticle stage is movable. Even in an exposure apparatus in which a reticle stage RSTG is fixed, the same alignment mark exposure as that in the third embodiment can be executed by the arrangement of the masking blade and movement of the wafer stage as far as the alignment mark falls outside the reticle region and within the projectable region of the projection lens. In addition, adjacent marks can be identified. These effects can also be attained in an electron beam exposure apparatus.

According to the above-described embodiments, an alignment mark can be printed at the outer peripheral portion of a wafer using functions mounted in advance in a semiconductor manufacturing apparatus. A program for controlling an exposure apparatus can be specialized in only exposure of a reticle pattern. This makes the exposure apparatus more convenient without decreasing the operation speed of the apparatus.

No region dedicated to an alignment mark need be prepared on a reticle, and the reticle area can be utilized best. According to this method, an alignment mark can be easily printed at the outer peripheral portion of a wafer. The resist can be removed from the outer peripheral portion of the wafer using the resist rinsing function, exposing the alignment mark. A shift of a measurement value by the resist or the like can be reduced in alignment mark measurement, which increases the semiconductor manufacturing yield.

The method of printing an alignment mark in a blank region on a wafer other than a scribe line is free from any restriction of utilizing a finite resource such as the length and width of a scribe line. The type and size of a mark, and the distance from an adjacent pattern can be set advantageously to alignment. This also contributes to an increase in semiconductor manufacturing yield.

The position of an alignment mark to be projected can be arranged at the central optical axis of the projection lens to optimize the image performance of the alignment mark to be projected. In this case, the mark does not deform under the influence of distortion, and an accurate mark position can be calculated to accurately obtain the wafer position on the wafer stage. As a result, the alignment performance is improved, contributing to the semiconductor manufacturing yield.

The identification method adopted when many alignment marks are printed adjacent to each other can prevent erroneous detection of an alignment mark printed in another step, and reduce the area necessary for an alignment mark.

[Other Embodiment]

The functions of the above-described embodiments are also achieved when software such as a program for realizing the pattern exposure flow of the embodiments is supplied to a system or apparatus directly or from a remote place, and the computer of the system or apparatus reads out and executes the supplied software. In this case, the software need not be a program as far as the software has a program function.

Hence, the embodiments of the present invention include software itself which is installed in a computer in order to realize the function or processing of the above-described embodiments.

In this case, the software includes an object code, a program executed by an interpreter, script data supplied to an operating system (OS), and the like. The type of software is not particularly limited.

The recording medium for supplying the software includes, e.g., a flexible disk, a hard disk, an optical disk, a magnetooptical disk, an MO, a CD-ROM, a CD-R, a magnetic tape, a nonvolatile memory card, a ROM, and a DVD (DVD-ROM or DVD-R).

The software can also be supplied by downloading the software itself or a compressed file containing an automatic installing function from an Internet homepage to a recording medium such as a hard disk by using the browser of a client computer. The software can also be supplied by dividing it into a plurality of files and downloading the files from different homepages. Hence, the embodiments of the present invention also include a World Wide Web (WWW )server, which allows the user to download the software.

The software can also be supplied by distributing to the user a storage medium such as a CD-ROM which stores the encrypted software, causing a user who satisfies predetermined conditions to download decryption key information from a homepage via the Internet, and installing in a computer the encrypted software by using the key information.

The functions of the above-described embodiments are realized by executing the readout software by a computer. The embodiments of the present invention also include a case in which an OS, or the like, running on the computer performs part of or all of actual processing on the basis of the instructions of the software, and this processing realizes the functions of the above-described embodiment.

Further, the embodiments of the present invention include a case in which, after the software read out from the recording medium is written in the memory of a function expansion board inserted into the computer or the memory of a function expansion unit connected to the computer, the CPU of the function expansion board or function expansion unit performs part or all of actual processing on the basis of the instructions of the software and this processing realizes the functions of the above-described embodiments.

As many apparently widely different embodiments of the present invention can be made without departing from the spirit and scope thereof, it is to be understood that the invention is not limited to the specific embodiments thereof except as defined in the appended claims.

What is claimed is:

1. An exposure method of projecting a pattern of an original onto a substrate, said method comprising steps of:
    measuring a position of an alignment mark formed on the substrate;
    projecting the pattern onto the substrate based on a measurement result in said measurement step; and
    projecting onto the substrate, based on the measurement result, a mark, which has a known relative position from a reference pattern arranged on an original stage and to align the original stage and a substrate stage, and is arranged on the original stage and to form an alignment mark on the substrate.

2. A method according to claim 1, further comprising a step of controlling a position of the original stage and a position of the substrate stage based on the measurement result.

3. A method according to claim 2, wherein in said control step, the position of the original stage and the position of the substrate stage are so controlled as to project the mark in a region which is in a peripheral region of the substrate and outside a region where the pattern is projected.

4. A method according to claim 1, wherein a plurality of kinds of the mark are arranged on the original stage.

5. A method according to claim 4, wherein the plurality of kinds of the mark include an identification mark for identifying one of the plurality of kinds of the mark.

6. A method according to claim 1, wherein the plurality of kinds of the mark are arranged on the original stage, and in said measurement step, a position of the alignment mark formed on the substrate is measured based on the kind.

7. A method according to claim 6, wherein in said measurement step, a position of an alignment mark of a second kind of the plurality of kinds of the mark is measured based on a position of an alignment mark of a first kind of the plurality of kinds of the mark.

8. A medium including software for causing a computer to control execution of an exposure method as defined in claim 1.

* * * * *

UNITED STATES PATENT AND TRADEMARK OFFICE
CERTIFICATE OF CORRECTION

PATENT NO. : 6,970,231 B2  
DATED : November 29, 2005  
INVENTOR(S) : Hiroshi Tanaka It is certified that error appears in the above-identified patent and that said Letters Patent is hereby corrected as shown below:

Column 11,  
Line 19, "or of" should read -- of or --.

Signed and Sealed this

Twenty-fifth Day of April, 2006

JON W. DUDAS  
*Director of the United States Patent and Trademark Office*